(12) United States Patent
Crow et al.

(10) Patent No.: US 7,058,247 B2
(45) Date of Patent: Jun. 6, 2006

(54) SILICON CARRIER FOR OPTICAL INTERCONNECT MODULES

(75) Inventors: John D. Crow, Claremont, CA (US); Casimer M. DeCusatis, Poughkeepsie, NY (US); Jeffrey A. Kash, Pleasantville, NY (US); Jean M. Trewhella, Peekskill, NY (US)

(73) Assignee: International Business Machines Corporation, Armonk, NY (US)

( * ) Notice: Subject to any disclaimer, the term of this patent is extended or adjusted under 35 U.S.C. 154(b) by 174 days.

(21) Appl. No.: 10/738,064

(22) Filed: Dec. 17, 2003

(65) Prior Publication Data

US 2005/0135732 A1    Jun. 23, 2005

(51) Int. Cl.
*G02B 6/12*    (2006.01)
(52) U.S. Cl. ..................................... 385/14
(58) Field of Classification Search .................. 385/14
See application file for complete search history.

(56) References Cited

U.S. PATENT DOCUMENTS

| 4,966,430 | A | 10/1990 | Weidel ..................... 385/14 |
| 5,386,137 | A | 1/1995 | Dell et al. ................... 257/458 |
| 5,600,130 | A | 2/1997 | VanZeghbroeck ......... 250/214.1 |
| 6,097,748 | A | 8/2000 | Huang et al. .......... 372/50.124 |
| 6,236,671 | B1 | 5/2001 | Babic ..................... 372/50.124 |
| 6,337,265 | B1 | 1/2002 | Trezza et al. ............... 438/612 |
| 2002/0141462 | A1 | 10/2002 | Komeda ................... 372/29.02 |
| 2004/0084745 | A1* | 5/2004 | Chen et al. ................ 257/499 |
| 2004/0120659 | A1* | 6/2004 | Cheng et al. ................ 385/89 |

FOREIGN PATENT DOCUMENTS

JP         2150089 A       2/1991

* cited by examiner

*Primary Examiner*—Frank G. Font
*Assistant Examiner*—Derek L. Dupuis
(74) *Attorney, Agent, or Firm*—Lily Neff; Cantor Colburn LLP (57) ABSTRACT

An embodiment of the invention is an optical interconnect module comprising a silicon carrier; a communication integrated circuit mounted on the silicon carrier and an optical integrated circuit flip chip mounted on the silicon carrier. The optical integrated circuit is in electrical communication with the communication integrated circuit by electrical paths in the silicon carrier. Optical paths in the silicon carrier provide optical coupling between the optical integrated circuit and an optical link.

17 Claims, 10 Drawing Sheets

SILICON CARRIER FOR OPTICAL INTERCONNECT MODULES

BACKGROUND OF THE INVENTION

The present disclosure relates generally to optical interconnects and particularly to a silicon carrier for optical interconnect modules.

Optical interconnects are used in a variety of application to couple optical components to electrical components. It is generally recognized that a preferred approach to this problem involves integration of optical components into multichip modules (MCMs) or single chip modules (SCMs). One existing technique includes directly mounting a laser array onto the silicon germanium (SiGe) laser driver chip. This approach, however, adds extra cost and creates difficult thermal challenges. The thermal challenges are twofold; first, the thermally sensitive laser is in intimate contact with the heat producing SiGe driver circuits which affects both laser performance and reliability. Second, a heat spreader on the driver circuit is made significantly less effective, since the contact area to the driver is small because the heat spreader must not contact the chip in the area of the laser and the driver wirebond pads.

The added cost comes from the SiGe chip, which may be greatly oversized to perform packaging functions as well as contain the necessary driver circuitry. The circuitry is not very efficiently layed out with this design, and is estimated to be less than 15% of the chip area. Thus, there is a well-established need for a new type of laser array package.

SUMMARY OF THE INVENTION

An embodiment of the invention is an optical interconnect module comprising a silicon carrier; a communication integrated circuit mounted on the silicon carrier and an optical integrated circuit flip chip mounted on the silicon carrier. The optical integrated circuit is in electrical communication with the communication integrated circuit by electrical paths in the silicon carrier. Optical paths in the silicon carrier provide optical coupling between the optical integrated circuit and an optical link.

BRIEF DESCRIPTION OF THE DRAWINGS

Referring to the exemplary drawings wherein like elements are numbered alike in the accompanying Figures.

DETAILED DESCRIPTION

Figure 1:
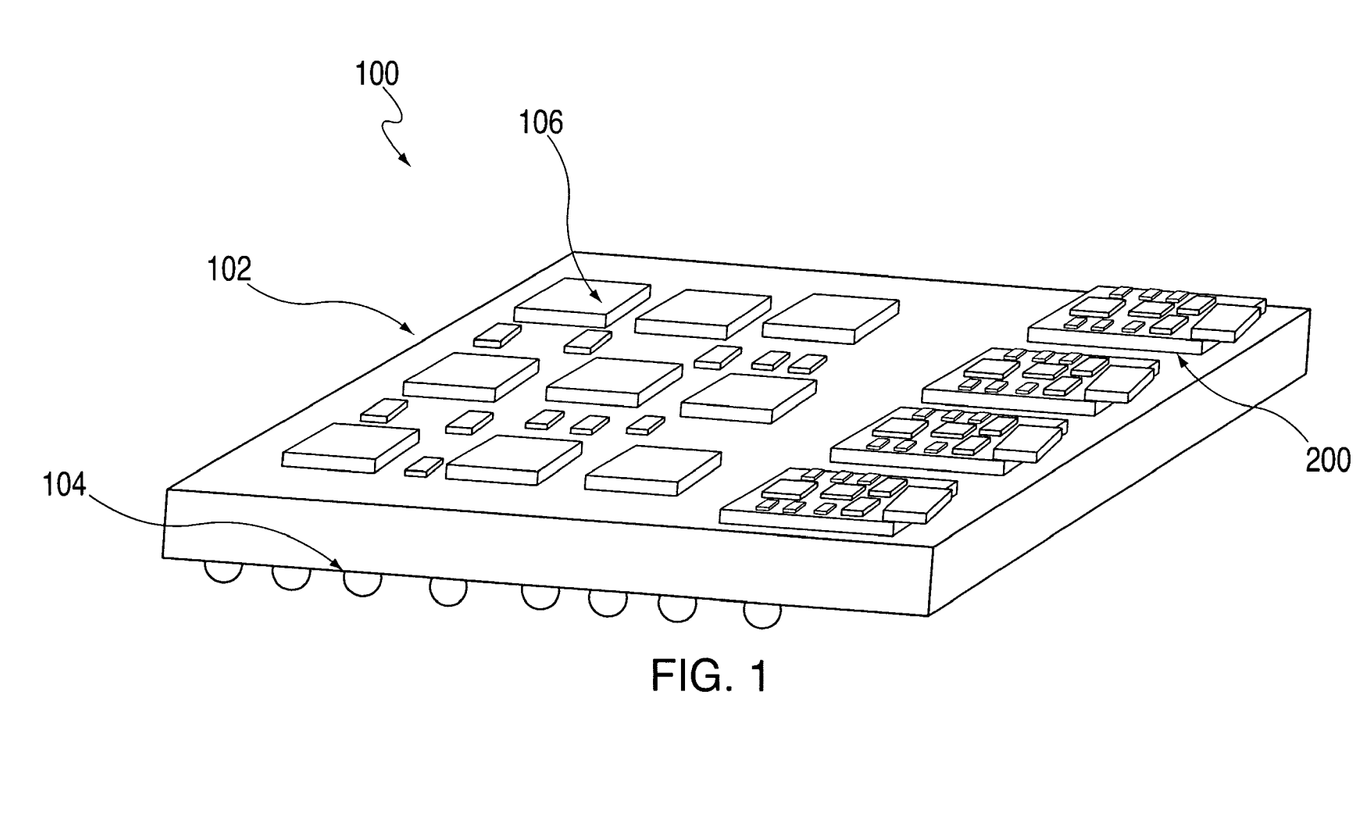
FIG. 1 is a perspective view of an optical interconnect assembly in an embodiment of the invention.

FIG. 1 is a perspective view of an optical interconnect assembly 100 in an embodiment of the invention. The optical interconnect assembly 100 includes a substrate 102. Substrate 102 may be a multilayer ceramic card, printed circuit board, etc. Interconnects 104 are positioned on the bottom of substrate 102. Although a ball grid array (BGA) is shown in FIG. 1, interconnects 104 may be any known type of electrical and/or optical interconnects.

The top surface of substrate 102 includes a number of integrated circuits 106. Integrated circuits (ICs) 106 are typically electrical components and coupled to interconnects 104 and/or optical interconnect modules 200 through electrical vias within substrate 102. ICs 106 may provide support functions for the optical interconnect modules 200 and be lower speed (e.g., 5–10 Gb/s) CMOS devices.

Figure 2:
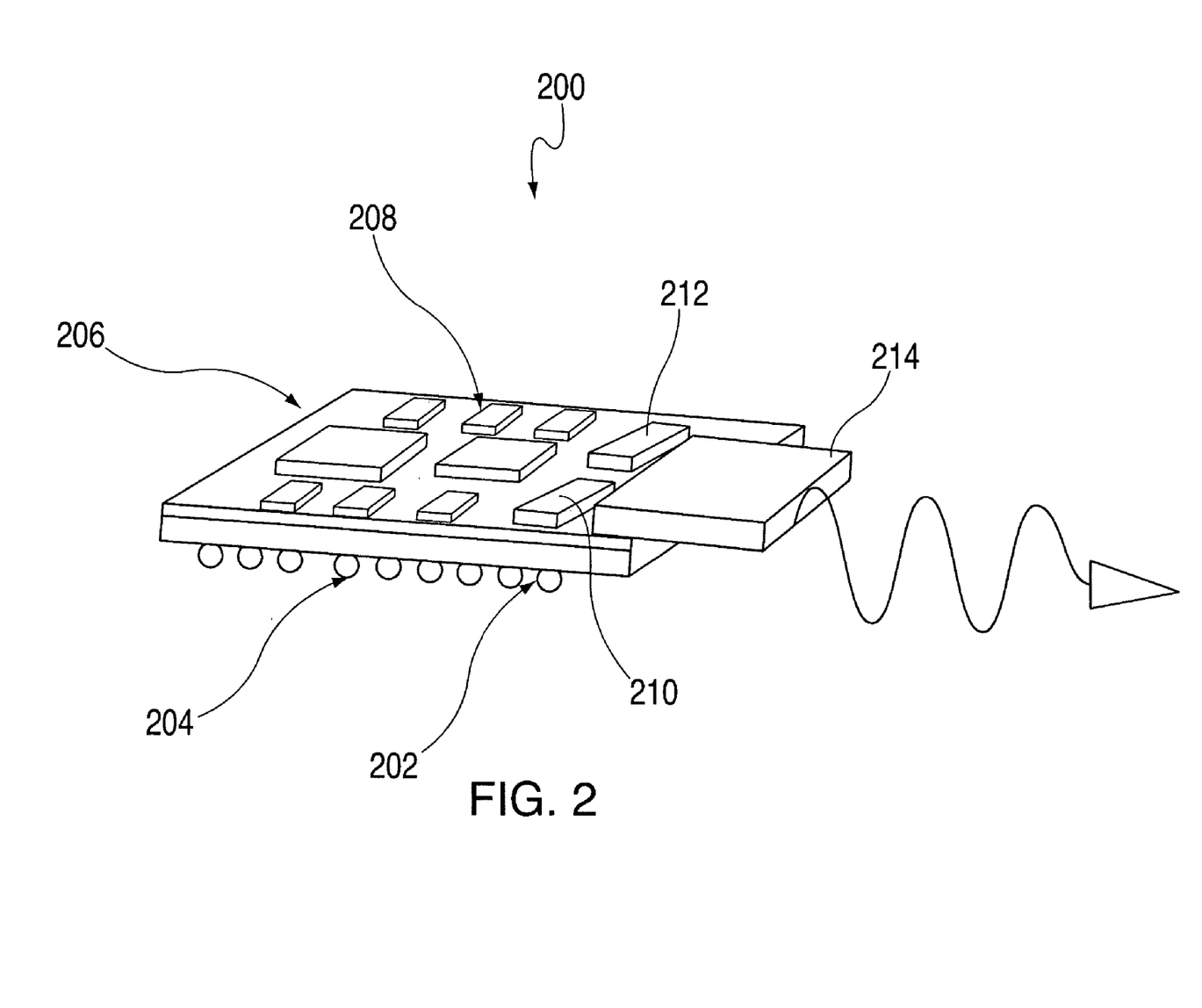
FIG. 2 is a perspective of an optical interconnect module in an embodiment of the invention.

FIG. 2 is a perspective of optical interconnect module 200 in an embodiment of the invention. Optical interconnect module 200 includes a carrier 202 which is a silicon platform having electrical and optical vias, imbedded passive devices (e.g., resistance, capacitance) and optical alignment elements. In one embodiment, silicon carrier 202 is 20 mm by 20 mm. Interconnects 204 are positioned on the bottom of the silicon carrier 202. Although a ball grid array (BGA) is shown in FIG. 2, interconnects 204 may be electrical or optical components, including flip-chip interconnects, that mate with corresponding interconnects on the top surface of substrate 102.

Also mounted on silicon carrier 202 are integrated circuits (ICs) 206 that provide signal processing functions such as signal coding and signal conditioning. In an embodiment, ICs 206 are lower speed (5–10 Gb/s) CMOS devices. ICs 206 are connected to interconnects 204 and other ICs through electrical paths in silicon carrier 202.

Communication ICs 208 are mounted on silicon carrier 202. The communication ICs 208 may be silicon-germanium (SiGe) devices operating at relatively higher speeds of 20–40 Gb/s. The communication ICs 208 interface with optical transmitter IC 210 and optical receiver IC 212 over electrical paths formed in the silicon carrier. The communication ICs 208 may include a driver IC for driving the optical transmitter IC 210 and an amplifier IC for amplifying signals received by optical receiver IC 212. The communication ICs 208 provide functions such as mux/demux, clocking, driving and amplifying for the optical integrated circuits including optical transmitter 210 and optical receiver 212.

The optical transmitter 210 and optical receiver 212 interface with an optical link 214 to send and receive optical signals to and from the optical interconnect module 200. In an embodiment, the optical transmitter 210 is a III–V compound VCSEL array and the optical receiver 212 is a photodiode array, both operating at relatively higher speeds of 20–40 Gb/s. Both the optical transmitter 210 and the optical receiver 212 are flip chip mounted to the silicon carrier 202. It is understood that separate transmitter and receiver ICs are not required and a single transceiver IC may be used.

The optical transmitter 210 and the optical receiver 212 are coupled to the optical link 214 by optical paths (fiber array, waveguide, etc.) embedded in silicon carrier 202. The optical link 214 transmits and receives optical signals having wavelengths transparent to the silicon carrier 202 (e.g., greater than about 1000 nm) along a distance of 2 m to 100 m before regeneration or reception. Optical transmission media (e.g., optical fiber) is coupled to optical link 214 to provide the transmission path.

Mounting CMOS ICs 206, SiGe ICs 208, the optical transmitter 210 and optical receiver 212 on a common carrier permits optimization of function and power consumption and cost. Thermal management issues, such as proximity of the VCSEL array 210 to the SiGe driver ICs 208, are also addressed by component placement on the carrier 202. A thermal spreader may be mounted to the entire top surface of communication ICs 208 since the entire surface is accessible. Noise is also minimized by placement of the VCSEL array 210 relative to the high speed SiGe communication ICs 208.

Figure 3:
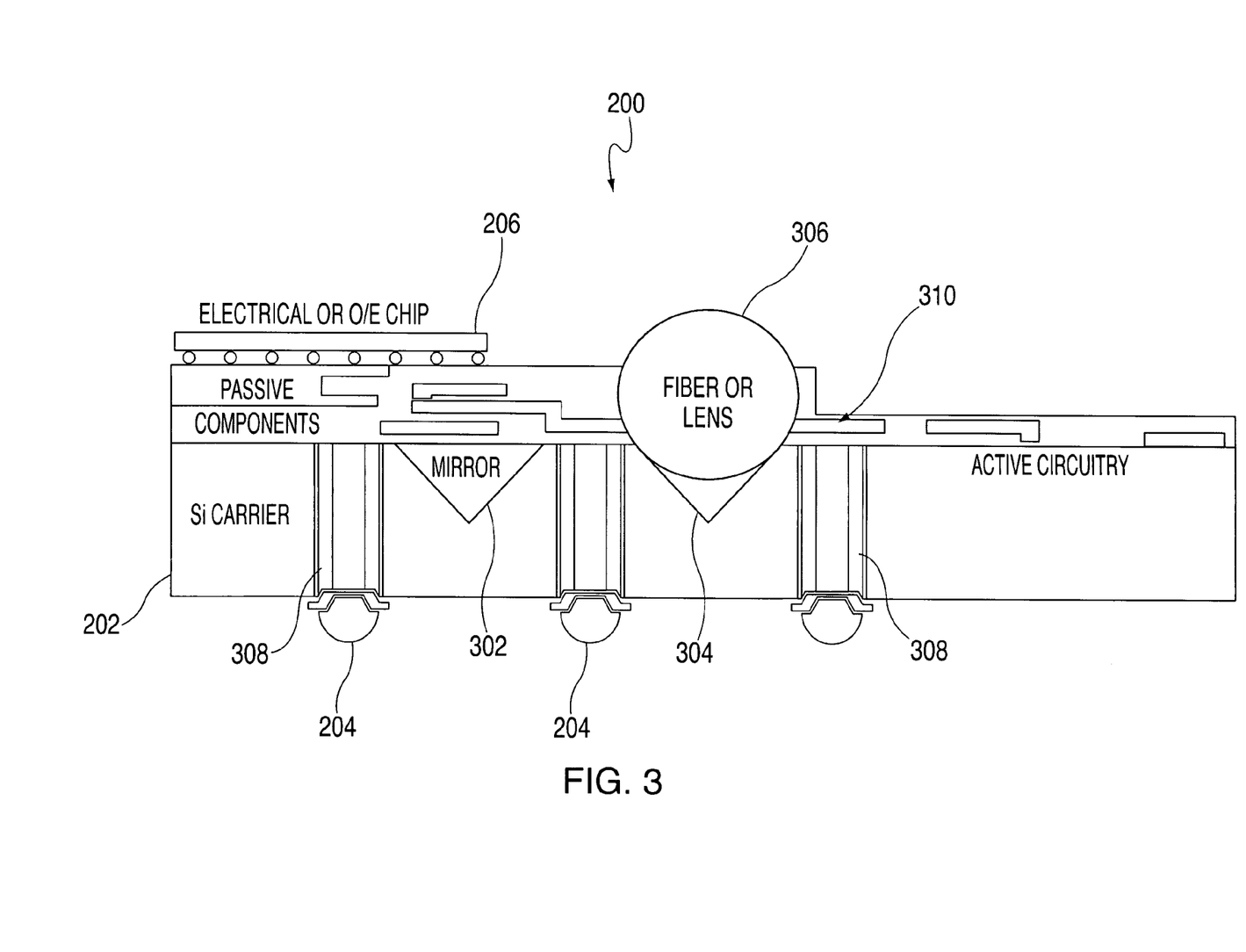
FIGS. 3–10 depict various optical and electrical interconnects for embodiments of the optical interconnect module.

A number of different optical and electrical elements may be incorporated in the silicon carrier 202 for mounting and/or interconnecting electrical and optical components. FIG. 3 is a cross sectional view of an optical interconnect module 200 in an embodiment of the invention. Silicon carrier 202 includes v-grooves for alignment of optical components. For example, v-groove 302 provides for positioning a mirror and v-groove 304 provides for positioning an optical fiber or lens 306. Electrical through vias 308 extend through silicon carrier 202 to interconnects 204. The through vias 308 may be formed using reactive ion etching (RIE) to define small scale (e.g., 50 micron diameter) holes that are filled with metal. Electrical paths and optical paths 310 may be formed in the silicon carrier 202 to connect with through vias 308 and optical components.

Figure 4:
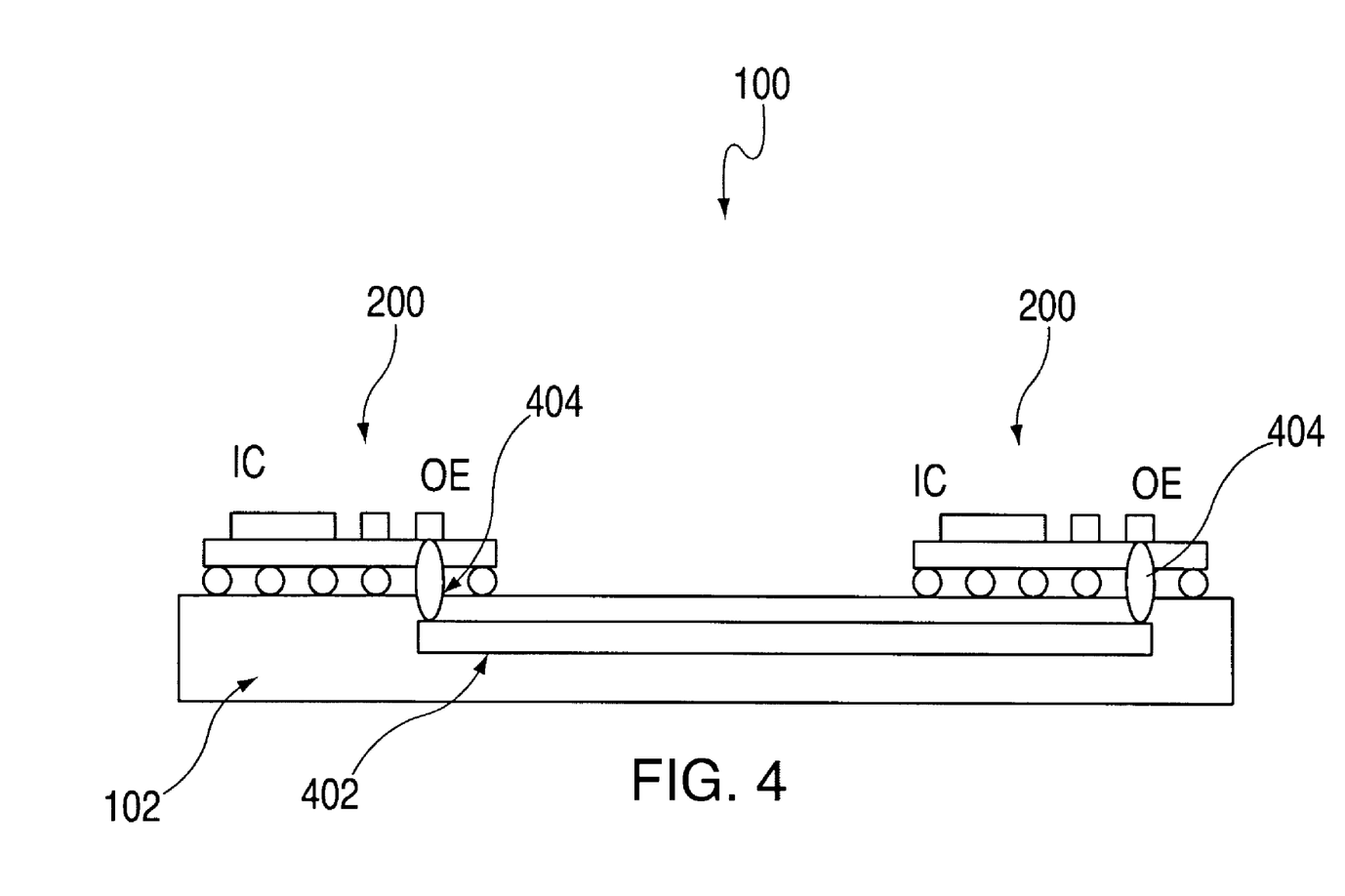

FIG. 4 is a cross-sectional view of an optical interconnect assembly 100 in an embodiment of the invention. Substrate 102 includes an optical path 402 (e.g., a waveguide) which may be embedded in substrate 102 or on the surface of substrate 102. Optical interconnect modules 200 include an optical via 404, described in further detail herein, coupling an optical element (e.g., optical transmitter or receiver) on optical interconnect module 200 to optical path 402. This allows optical modules 200 on the surface of substrate 102 to establish optical communication.

Figure 5:
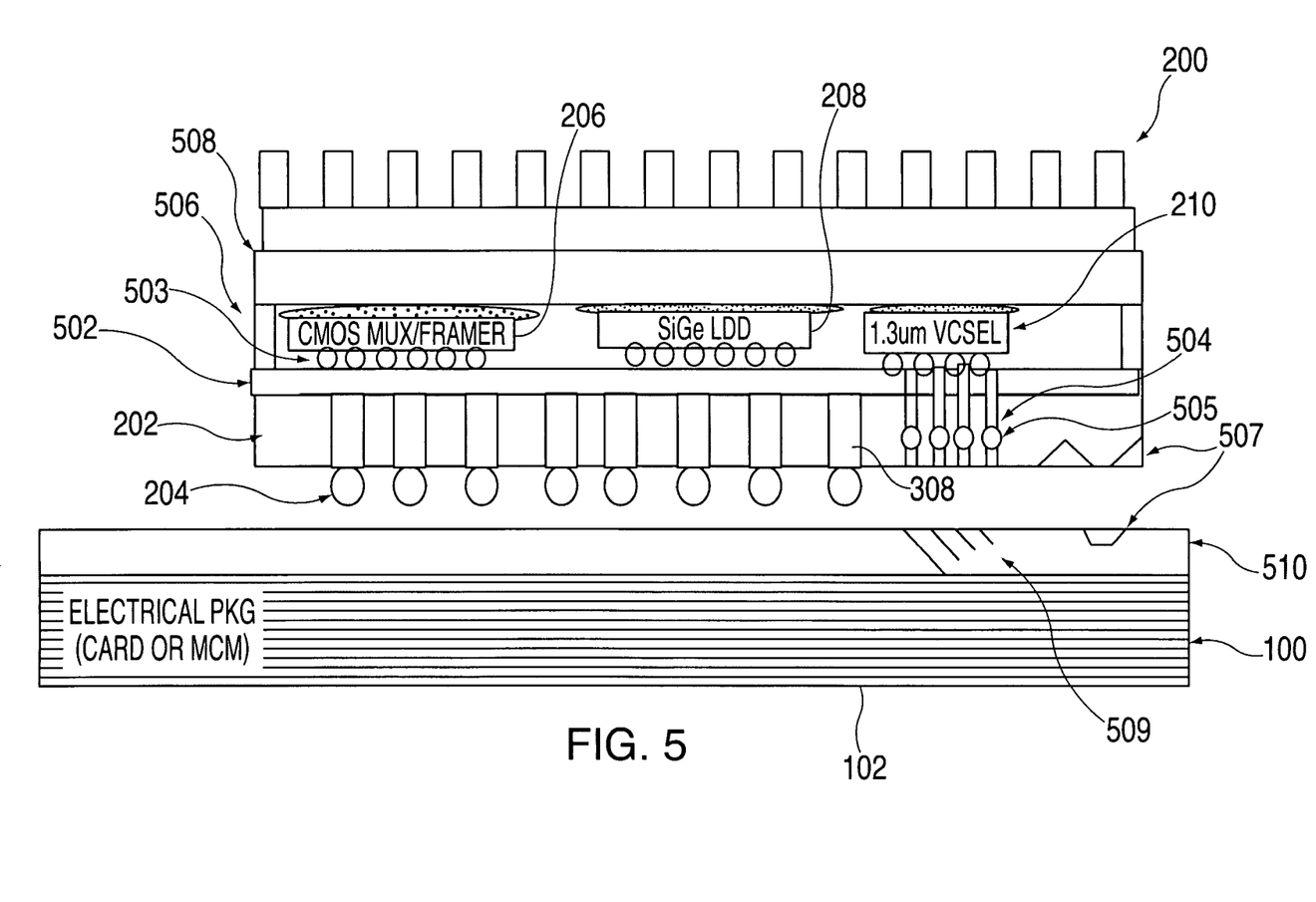

FIG. 5 is a cross-sectional view of an optical interconnect assembly 100 with optical interconnect module 200 in an embodiment of the invention. Silicon carrier 202 includes multilayer wiring 502 (e.g., beryllium oxide) to provide electrical connection between ICs 206, 208 and 210. ICs 206, 208 and 210 make electrical contact with electrical paths on silicon carrier 202 through electrical interconnects 503 (e.g., micro ball grid array). A frame 506 encloses the ICs and provide a hermetic enclosure for the optical interconnect module 200. A thermal spreader 508 is mounted on frame 506 and is in thermal contact with ICs 206, 208 and 210. This allows the entire surface of the high speed IC 208 to be in thermal contact with the thermal spreader. Optical vias 504 are formed in silicon carrier 202 and may include a passage fitted with a silicon micro-lens 505. If glass or polymer lenses are used, the optical transmitter 210 and optical receiver 212 may operate at wavelengths of about 850 nm.

Substrate 102 includes an optical path layer 510 including waveguides 509 (e.g., total internal reflection mirrors) in optical communication with optical vias 504. Waveguides 509 provide for routing optical signals on the substrate 102. The optical receiver 212 may be interconnected using similar optical vias. Alignment features 507 provide for alignment of the optical vias 504 with the waveguides 509. The alignment features 507 are mechanical alignment features that interfere to align the silicon carrier 2020 with substrate 102. The alignment features may be etched in the silicon carrier 202 at the same time optical vias 504 are formed.

Figure 6:
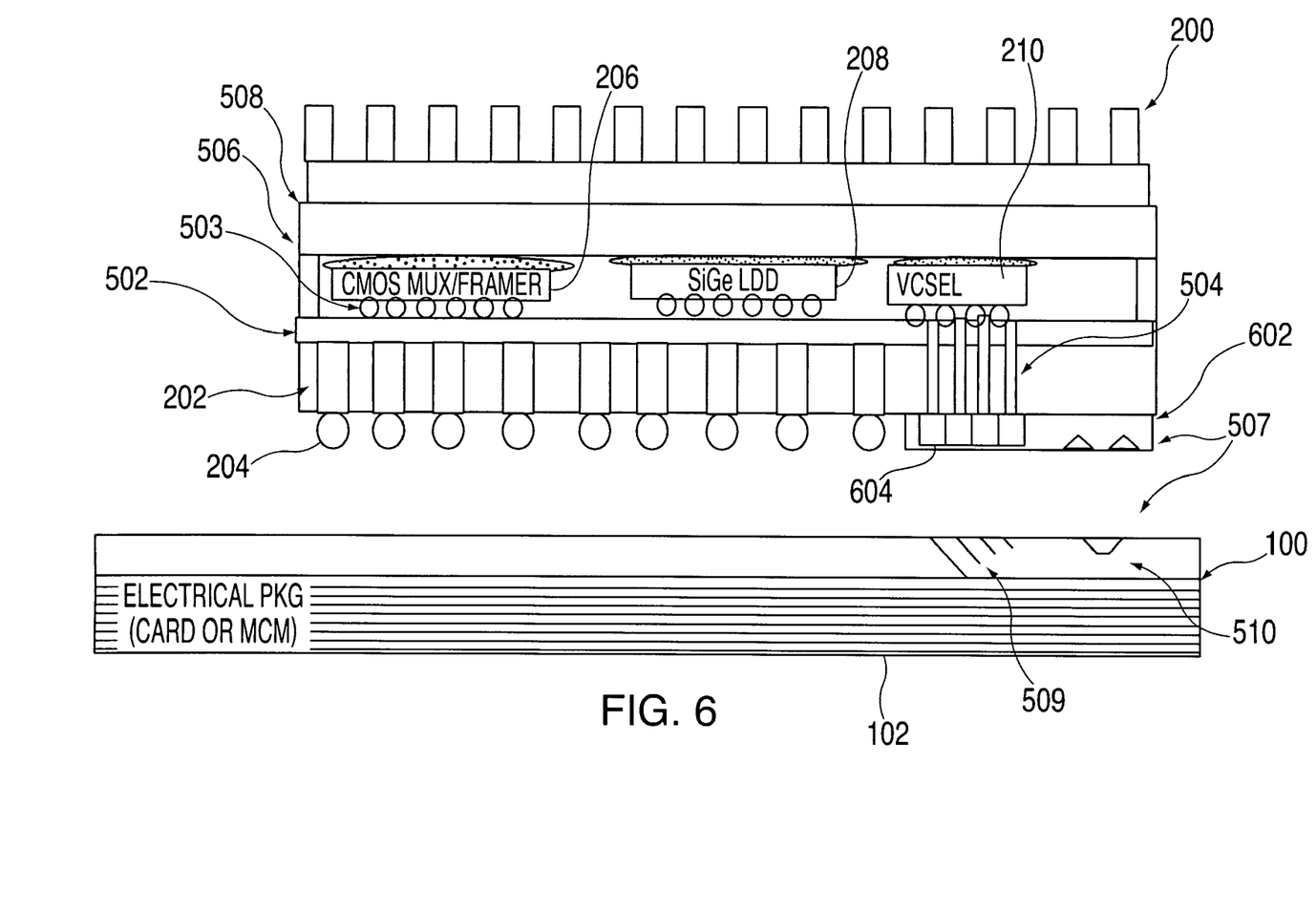

FIG. 6 is a cross-sectional view of an optical interconnect assembly 100 with optical interconnect module 200 in an embodiment of the invention. The optical interconnect module 200 is similar to that in FIG. 5 but includes a glass layer 602 which provides the optical interconnect between optical transmitter 210 and waveguides 509. An array of lenses 604 is formed in the glass layer 602 to optically couple optical transmitter 210 to waveguides 509. The optical receiver 212 may be interconnected using similar optical vias. Additional lenses may be used to operate the optical transmitter and optical receiver at 850 nm.

Figure 7:
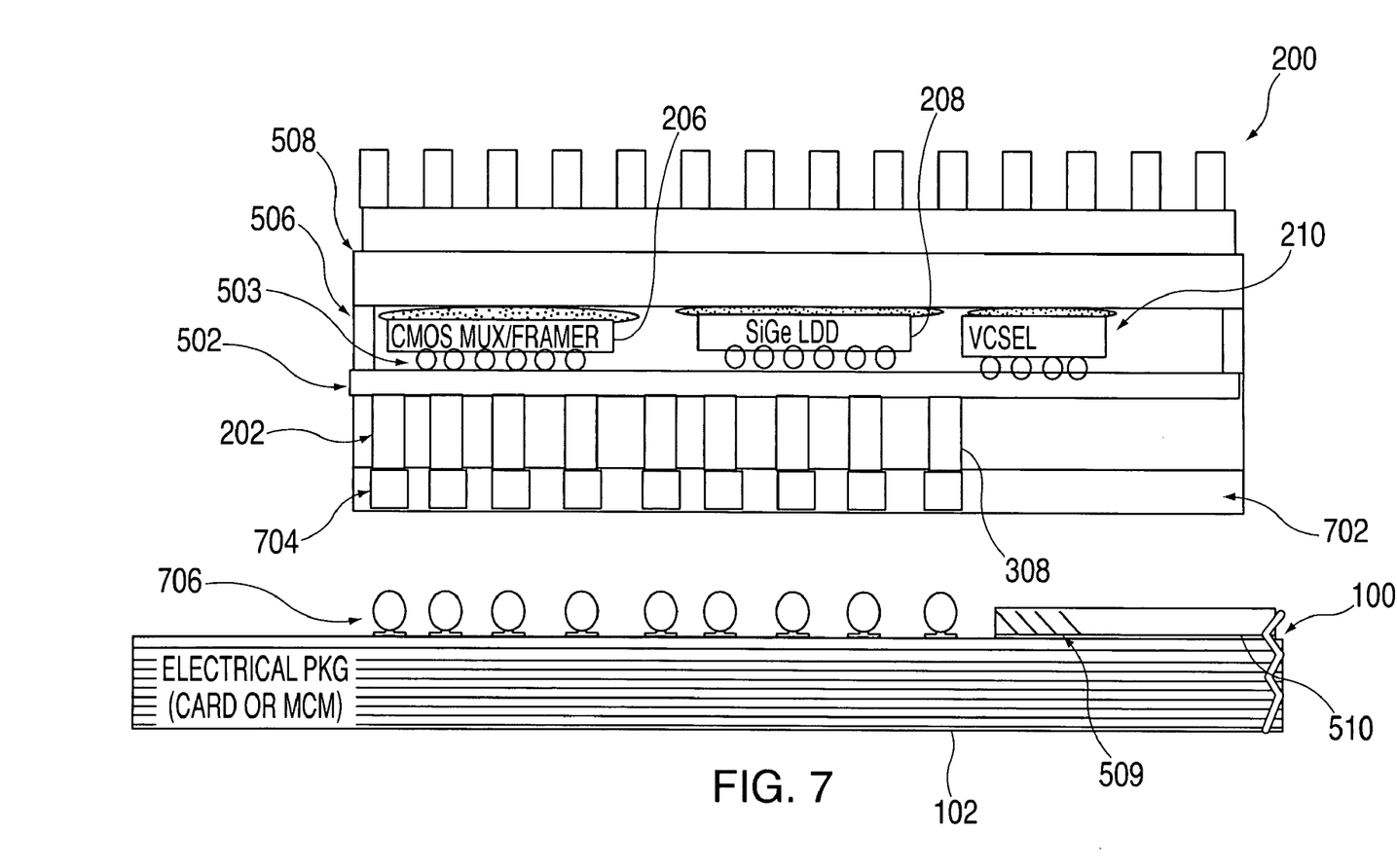

FIG. 7 is a cross-sectional view of an optical interconnect assembly 100 with optical interconnect module 200 in an embodiment of the invention. The optical interconnect module 200 is similar to that in FIG. 5 but includes an index of refraction matching layer 702 on the bottom of silicon carrier 202. The optical transmitter 210 emits light in a wavelength transparent to the silicon carrier (e.g., greater than about 1000 nm). In this embodiment, the silicon carrier 202 is anti-reflective coated with Nitride at ¼ wavelength. Light emitted from optical transmitter 210 passes through the carrier 202, through index matching layer 702 to waveguides 509. Openings 704 are provided in the index matching layer 702 to allow electrical conductive vias 308 to make contact with electrical interconnects 706 (BGA, C4) on the top of substrate 102. Lenses may be incorporated in the silicon carrier 202 to direct light to and from waveguides 509 and optical transmitter 210 and optical receiver 212.

Figure 8:
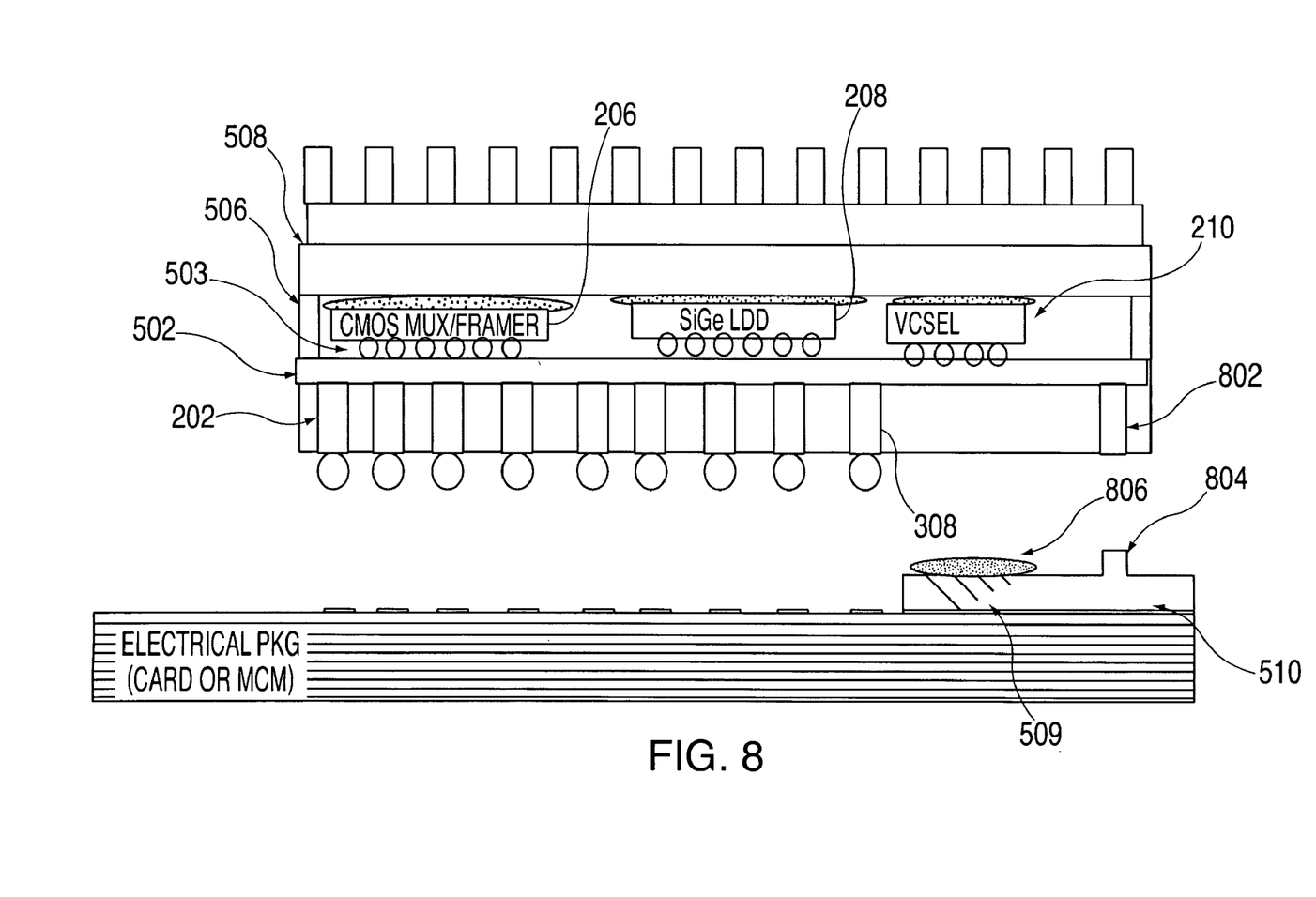

FIG. 8 is a cross-sectional view of an optical interconnect assembly 100 with optical interconnect module 200 in an embodiment of the invention. The optical interconnect module 200 is similar to that in FIG. 7 but includes an index of refraction matching underfill 806, rather than layer 702. Further, alignment of the optical interconnect module 200 and the substrate 102 is achieved through one or more openings 802 in carrier 202 and a corresponding number of posts 804 in optical path layer 510. Alternately, known interconnect alignment techniques (e.g., C4 self alignment) may be used to position the optical interconnect module 200 relative to substrate 102.

Figure 9:
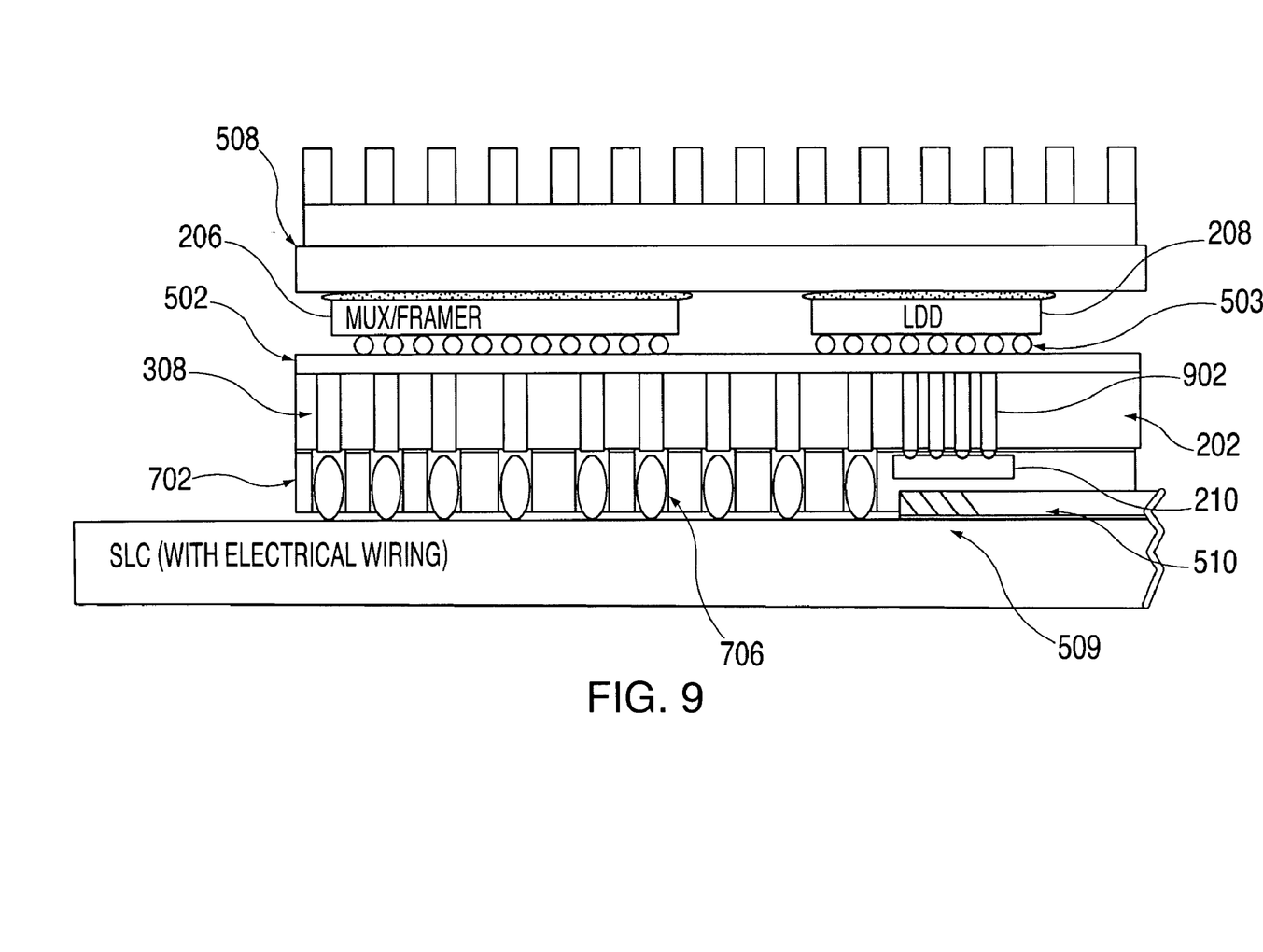

FIG. 9 is a cross-sectional view of an optical interconnect assembly 100 with optical interconnect module 200 in an embodiment of the invention. In this embodiment, the optical integrated circuits (e.g, optical transmitter and/or optical receiver) are mounted on the opposite side of the silicon carrier 202 as ICs 206 and 208. FIG. 9 shows optical transmitter 210 mounted on the bottom of silicon carrier 202 positioned within index matching layer 702. Electrical vias 902 connect the ICs 208 and/or 206 to the optical transmitter 210. The optical transmitter 210 emits light to waveguides 509.

Figure 10:
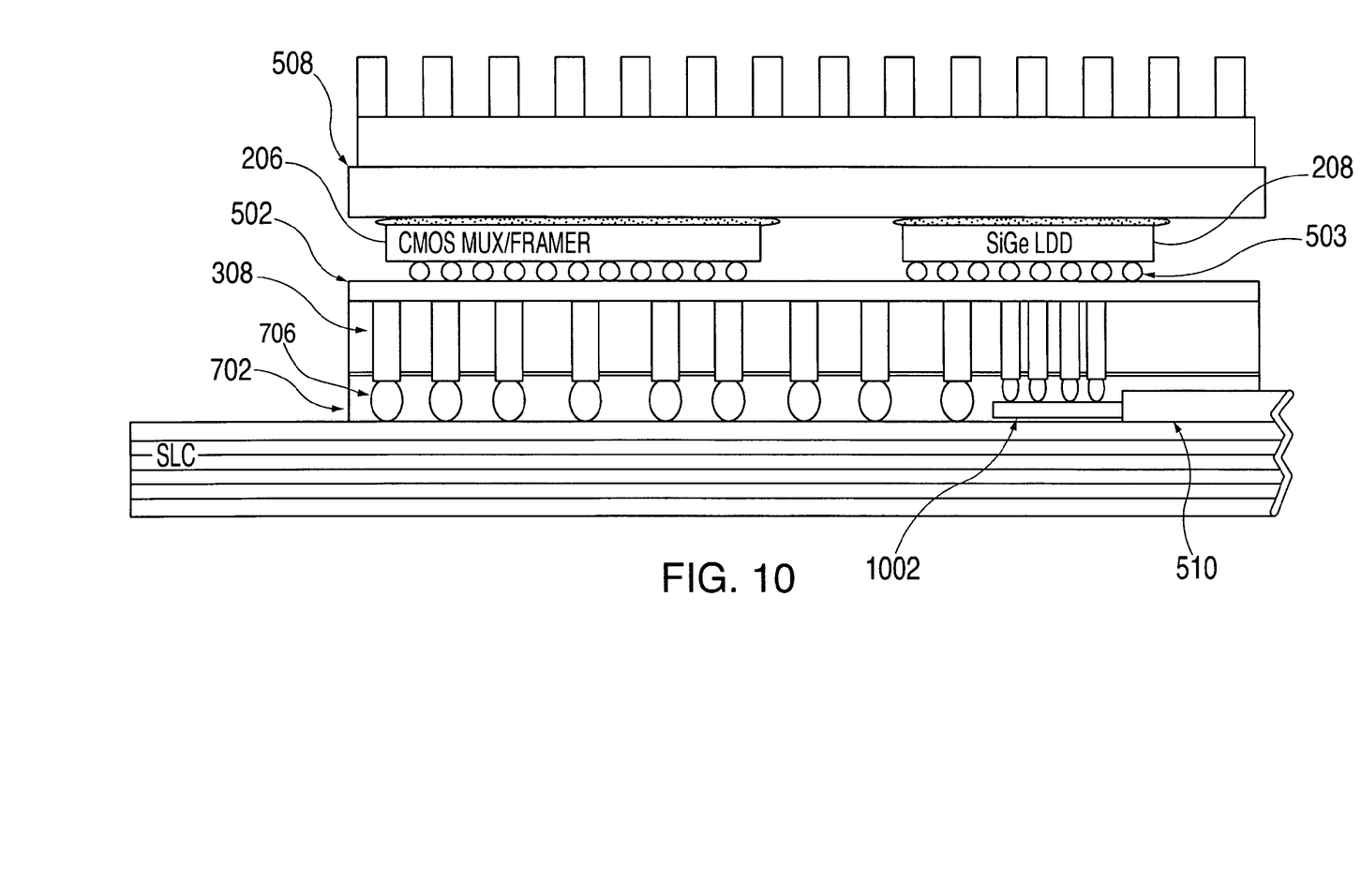

FIG. 10 is a cross-sectional view of an optical interconnect assembly 100 with optical interconnect module 200 in an embodiment of the invention. The embodiment of FIG. 9 is similar to that of FIG. 9 but the optical integrated circuit is an edge emitting, microresonator 1002. The microresonator is embedded within index matching layer 702. The microresonator 1002 utilizes a butt coupling to optically interface with optical path layer 510.

Embodiments of the invention decouple the packaging issues from the circuitry issues and uses a lower cost Si carrier 202 for the packaging aspects. The Si carrier 202 area is estimated to be between 5 to 10×less expensive (at cost) than 6 HP SiGe. The Si carrier 202 for the optical interconnect module 200 may be designed for direct attachment to a flex lead, to the substrate 102 with through-vias and C4s, or for direct attachment to a PCB with a BGA. The optical transmitter 210, optical receiver 212 and communication ICs 208 may be assembled with Si carrier 202 in a hermetic or near-hermetic package, using a glass cover slip and standard optical array connectors, which further enhances their integration into an MCM package. The close integration of the optical transmitter 210, the optical receiver 212 and communication ICs 208 minimizes electrical noise and facilitates high data rate modulation of the lasers.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best or only mode contemplated for carrying out this invention, but that the invention will include all embodiments falling within the scope of the appended claims. Moreover, the use of the terms first, second, etc. do not denote any order or importance, but rather the terms first, second, etc. are used to distinguish one element from another. Furthermore, the use of the terms a, an, etc. do not denote a limitation of quantity, but rather denote the presence of at least one of the referenced item.

What is claimed is:

1. An optical interconnect module comprising:
   a silicon carrier;
   a communication integrated circuit mounted on said silicon carrier, said communication integrated circuit is a silicon germanium integrated circuit;
   an optical integrated circuit flip chip mounted on said silicon carrier, said optical integrated circuit in electrical communication with said communication integrated circuit by electrical paths in said silicon carrier;
   an optical path in said silicon carrier, said optical integrated circuit in optical communication with an optical link by said optical path in said silicon carrier;
   a signal processing integrated circuit mounted to said silicon carrier, said signal processing integrated circuit operating at a speed lower than said communication integrated circuit, said signal processing integrated circuit is a CMOS integrated circuit;
   a thermal spreader in thermal communication with the communication integrated circuit, optical integrated circuit and signal processing integrated circuit.

2. The optical interconnect module of claim 1 wherein:
   said communication integrated circuit includes a driver integrated circuit and an amplifier integrated circuit.

3. The optical interconnect module of claim 4 wherein:
   said optical integrated circuit includes an optical transceiver in electrical communication with said driver integrated circuit and said amplifier integrated circuit.

4. The optical interconnect module of claim 2 wherein:
   said optical integrated circuit includes an optical transmitter in electrical communication with said driver integrated circuit and an optical receiver in electrical communication with said amplifier integrated circuit.

5. The optical interconnect module of claim 4 wherein:
   said optical transmitter is a VCSEL stray.

6. The optical interconnect module of claim 4 wherein:
   said optical receiver is a photodiode array.

7. The optical interconnect module of claim 1 wherein:
   said silicon carrier includes a v-grooves for aligning optical components to said silicon carrier.

8. The optical interconnect module of claim 1 wherein:
   said silicon carrier includes an optical via through said silicon carrier.

9. The optical interconnect module of claim 8 wherein:
   said optical path includes a passage fitted with a silicon lens.

10. The optical interconnect module of claim 8 wherein:
    said optical path includes a passage fitted with a glass lens.

11. The optical interconnect module of claim 8 wherein:
    said optical path includes a passage fitted with a polymer lens.

12. The optical interconnect module of claim 8 wherein:
    said optical path includes a passage; and
    glass layer with array of lenses at one end of said path.

13. The optical interconnect module of claim 8 wherein:
    said optical path includes an optical transmission path through said silicon carrier; and
    index matching layer on a surface of said silicon carrier.

14. The optical interconnect module of claim 8 further comprising:
    a substrate supporting the silicon carrier, said substrate including electrical interconnects for contacting said electrical paths in said silicon carrier,
    said substrate further including an optical path layer having an optical element for establishing an optical path with said optical via in said silicon carrier,
    said substrate and said silicon carrier including an alignment feature for aligning said optical element and said optical via.

15. The optical interconnect module of claim 1 wherein:
    said optical integrated circuit is positioned on an opposite side of said silicon carrier as said communication integrated circuit.

16. The optical interconnect module of claim 15 wherein:
    said optical integrated circuit is a microresonator.

17. The optical interconnect module of claim 1 further comprising:
    alignment feature on said silicon carrier for aligning said optical path with a substrate.

* * * * *